United States Patent
Refai-Ahmed et al.

(10) Patent No.: US 12,315,781 B2
(45) Date of Patent: May 27, 2025

(54) HEAT SPREADER FOR A SEMICONDUCTOR PACKAGE

(71) Applicant: XILINX, INC., San Jose, CA (US)

(72) Inventors: Gamal Refai-Ahmed, Santa Clara, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 705 days.

(21) Appl. No.: 17/564,114

(22) Filed: Dec. 28, 2021

(65) Prior Publication Data
US 2023/0207422 A1 Jun. 29, 2023

(51) Int. Cl.
*H01L 23/48* (2006.01)
*H01L 23/427* (2006.01)

(52) U.S. Cl.
CPC ................ *H01L 23/427* (2013.01)

(58) Field of Classification Search
CPC ......... H01L 25/0657; H01L 2224/0233; H01L 23/427
See application file for complete search history.

(56) References Cited

U.S. PATENT DOCUMENTS

| | | |
|---|---|---|
| 9,006,030 B1 | 4/2015 | Kwon et al. |
| 9,812,374 B1 | 11/2017 | Refai-Ahmed et al. |
| 9,947,560 B1 | 4/2018 | Mardi et al. |
| 10,043,730 B2 | 8/2018 | Refai-Ahmed et al. |
| 10,147,664 B2 | 12/2018 | Refai-Ahmed et al. |
| 10,262,920 B1 * | 4/2019 | Refai-Ahmed ..... H01L 23/4275 |
| 10,529,645 B2 | 1/2020 | Gandhi et al. |
| 10,629,512 B2 | 4/2020 | Pan et al. |
| 10,720,377 B2 | 7/2020 | Refai-Ahmed et al. |
| 11,145,566 B2 | 10/2021 | Refai-Ahmed et al. |
| 11,195,780 B1 | 12/2021 | Gandhi et al. |
| 11,246,211 B1 | 2/2022 | Refai-Ahmed et al. |
| 2010/0230805 A1 * | 9/2010 | Refai-Ahmed ......... H01L 23/36 438/107 |
| 2018/0144963 A1 | 5/2018 | Refai-Ahmed et al. |
| 2018/0308783 A1 | 10/2018 | Refai-Ahmed et al. |
| 2018/0358280 A1 | 12/2018 | Gandhi et al. |
| 2019/0318975 A1 | 10/2019 | Shi et al. |
| 2020/0105642 A1 | 4/2020 | Gandhi et al. |
| 2020/0152546 A1 | 5/2020 | Refai-Ahmed et al. |
| 2020/0219789 A1 * | 7/2020 | Uppal ................. H01L 21/4882 |
| 2021/0134757 A1 | 5/2021 | Gandhi et al. |
| 2021/0193620 A1 | 6/2021 | Refai-Ahmed et al. |
| 2021/0249328 A1 | 8/2021 | Refai-Ahmed et al. |

FOREIGN PATENT DOCUMENTS

| | | |
|---|---|---|
| EP | 3815135 A1 | 5/2021 |
| WO | 2021252037 A2 | 12/2021 |

* cited by examiner

*Primary Examiner* — Hoa B Trinh
(74) *Attorney, Agent, or Firm* — Patterson + Sheridan, LLP

(57) ABSTRACT

Disclosed herein is a heat spreader for use with an IC package, the heat spreader having features for enhanced temperature control of the IC package. A heat spreader for use with an IC package is disclosed. In one example, the heat spreader includes a metal body that has a sealed internal cavity. A thermally conductive material fills the sealed internal cavity. The thermally conductive material has an interstitial space sufficient to allow fluid to pass therethrough. A first phase change material fills at least a portion of the interstitial space of the thermally conductive material.

20 Claims, 6 Drawing Sheets

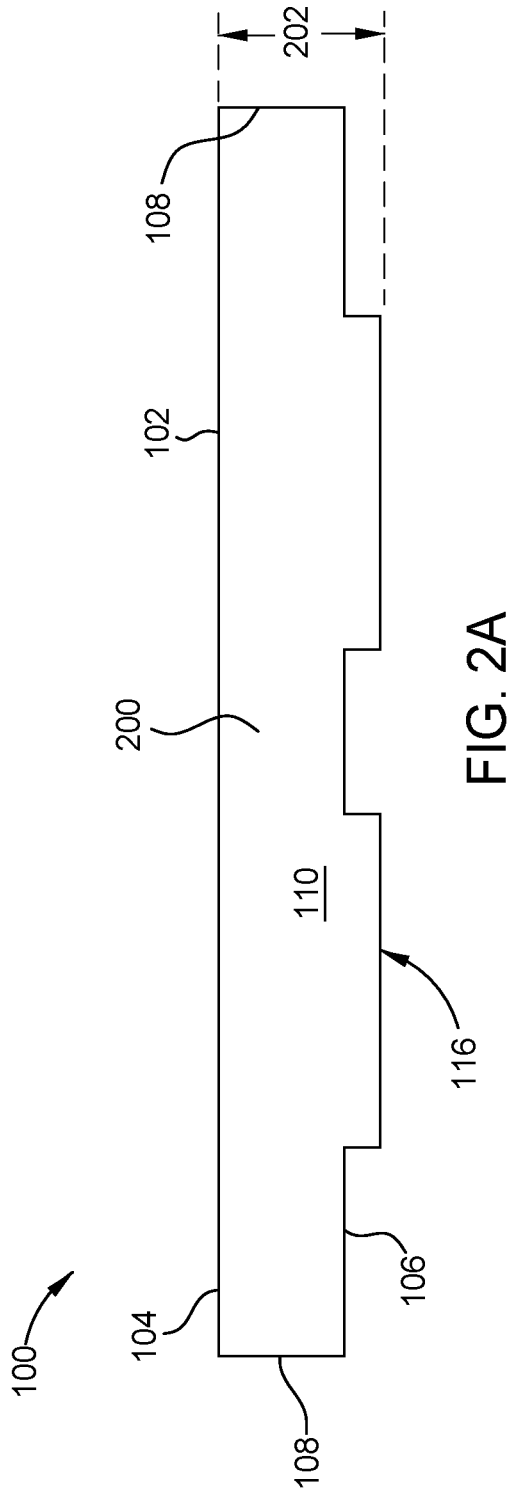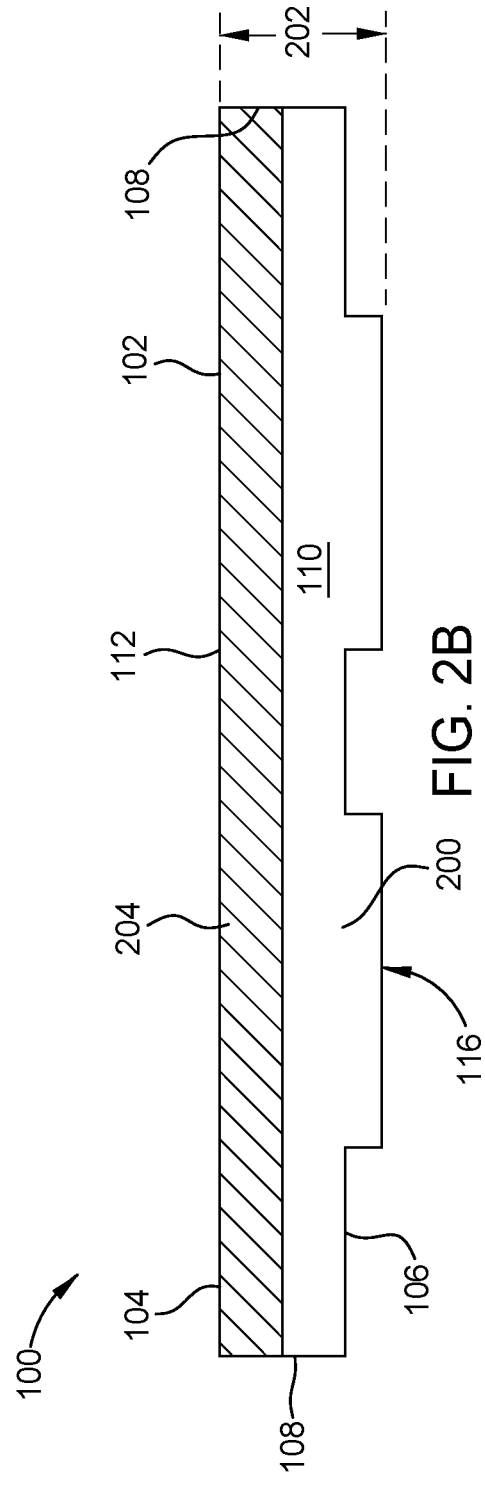

HEAT SPREADER FOR A SEMICONDUCTOR PACKAGE

TECHNICAL FIELD

Examples of the present disclosure generally relate to a heat spreader for use with an integrated circuit (IC) package, the heat spreader having features for enhanced temperature control of the IC package.

RELATED ART

Electronic devices, such as tablets, computers, copiers, digital cameras, smart phones, control systems and automated teller machines, among others, often employ electronic components which leverage chip packages for increased functionality and higher component density. Conventional chip packaging schemes often utilize package substrates, often in conjunction with a through-silicon-via (TSV) interposer, to enable a plurality of IC dies to be mounted to a single substrate. The IC dies may include memory, logic or other IC device.

In packages having two or more dies that also include a lid (e.g., heat spreader), tolerance issues and differences in die heights often cause one die to transfer heat to the lid at a much different rate relative to another die in the package. The difference in heat transfer may cause one die to operate much differently than other. In addition, a lid can be used secured over one or more of the IC dies using an adhesive. However, the rigid connection between the lid and die often leads to poor temperature control. Moreover, the rigid connection between the lid and chip package may also undesirably increase the amount of stress induced on the chip package. As such, the heat produced from the one or more IC dies and the heat retained by lid, adhesive, and other components that may have different operating temperatures, complicate conventional temperature control methods and devices.

Therefore, a need exists for an improved heat dissipating mechanism for temperature control.

SUMMARY

A heat spreader for use with an IC package is disclosed. In one example, the heat spreader includes a metal body that has a sealed internal cavity. A thermally conductive material fills the sealed internal cavity. The thermally conductive material has an interstitial space sufficient to allow fluid to pass therethrough. A first phase change material fills at least a portion of the interstitial space of the thermally conductive material.

In another example, an electronic device includes a chip package that has at least a first IC die. The electronic device includes a heat spreader that includes a metal body having a sealed internal cavity contacting the first IC die. A thermally conductive material fills the sealed internal cavity. The thermally conductive material has an interstitial space sufficient to allow fluid to pass therethrough. A first phase change material fills at least a portion of the interstitial space of the thermally conductive material.

BRIEF DESCRIPTION OF THE DRAWINGS

So that the manner in which the above recited features of the present invention can be understood in detail, a more particular description of the invention, briefly summarized above, may be had by reference to examples, some of which are illustrated in the appended drawings. It is to be noted, however, that the appended drawings illustrate only typical examples of this invention and are therefore not to be considered limiting of its scope, for the invention may admit to other equally effective examples.

FIG. 2A illustrates a first phase change material disposed within an internal cavity of the heat spreader shown in FIG. 1.

FIG. 2B shows a second phase change material and the first phase change material disposed within an internal cavity of the heat spreader shown in FIG. 1.

To facilitate understanding, identical reference numerals have been used, where possible, to designate identical elements that are common to the figures. It is contemplated that elements of one example may be beneficially incorporated in other examples.

DETAILED DESCRIPTION

A heat spreader for use with an IC package is herein disclosed. The heat spreader includes features that enhance heat transfer from IC dies having a conductive heat transfer path to the heat spreader. Conventional hollow heat spreaders often are thin walled hollow bodies filled with fluid and/or vapor. However, the thin walls of conventional heat spreaders risk deformation, warpage and disengagement from surrounding structures when excessive heating turns all the fluid within the heat spreader to vapor. As such, the conventional conventional heat spreaders may warp or deform, and in some cases completely fail, leading to inadequate heat removal from the IC dies interfaced with the heat spreader.

Novel heat spreaders disclosed herein are much less prone to deformation compared to conventional heat spreaders. The heat spreaders disclosed herein include a hollow body filled a thermally conductive material. The thermally conductive material has interstitial spaces that allow fluid to flow therethrough. In addition, one or more phase change materials fill the interstitial space of the thermally conductive material. Advantageously, the heat spreader enables better device performance over a wider range of operating conditions, with less expense and manufacturing complexity, by reducing the frequency at which the IC device relies on a fan or other cooling device to ensure that the IC device remains within operating temperatures. The heat spreader can be used with active cooling devices, passive cooling devices, fins, or combinations thereof. An additional advantage is that the enhanced heat transfer control between the IC die and the heat spreader is reduced delamination and warpage of the chip package due to induced thermal stress.

Figure 1:
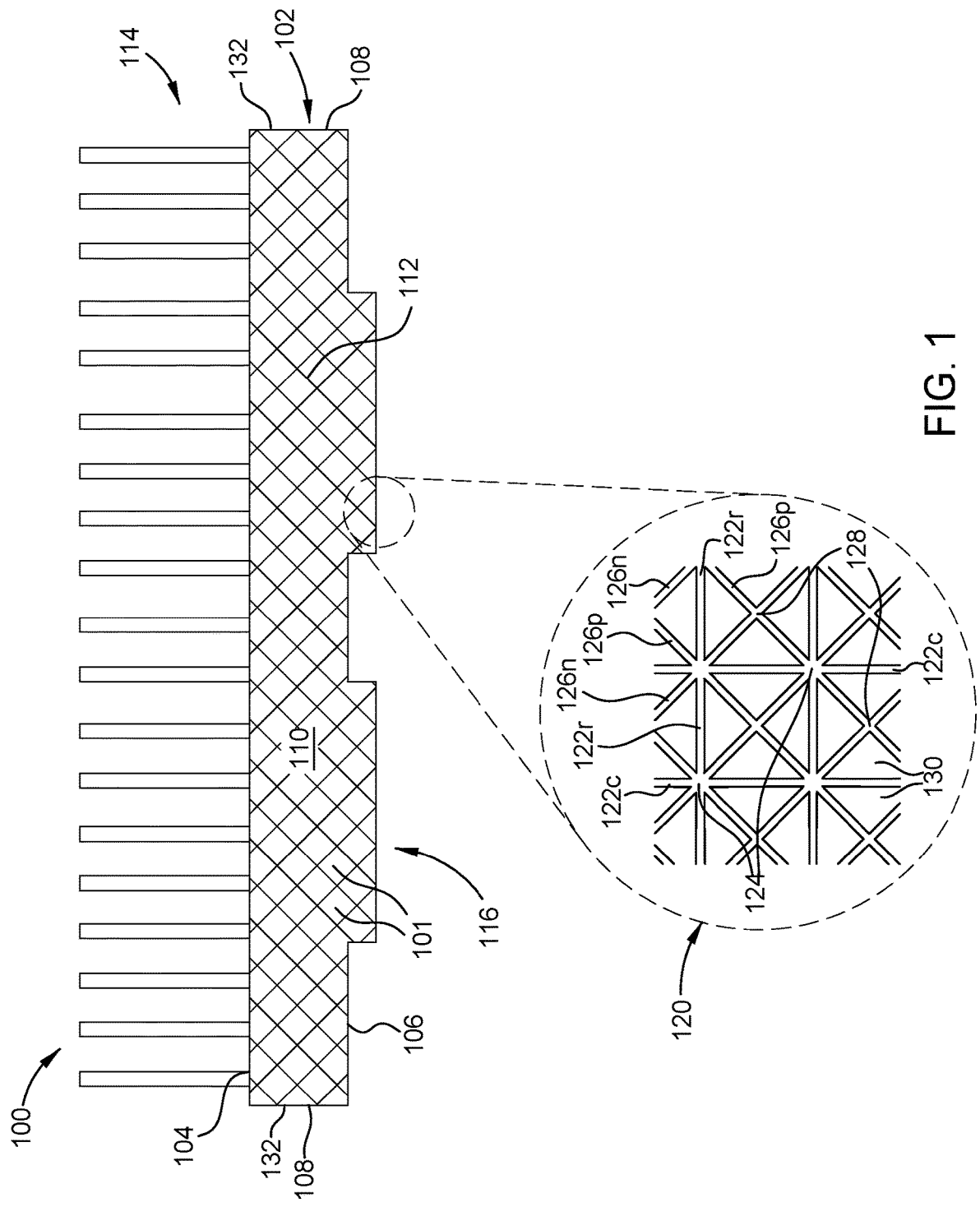
FIG. 1 is illustrates a heat spreader having a thermally conductive material disposed therein.

FIG. 1 is illustrates a heat spreader 100 having a thermally conductive material 112 disposed therein. The heat spreader 100 includes a hollow body 102 having a top surface 104, bottom surface 106, and sidewalls 108 that define an internal cavity 110. A solid, thermally conductive material 112 is disposed in the internal cavity 110. In one example, the thermally conductive material 112 fills at least 80 percent by volume of the internal cavity 110. In another example, the thermally conductive material 112 fills at least 90 percent by volume of the internal cavity 110. The conductive material 112 is configured to allow fluid to pass through interstitial spaces 101 formed in or through the conductive material 112. For example, the conductive material 112 may be permeable, porous, perforated, foamed, a wire mesh, fibrous, open celled, honeycombed, or have another structure or physical property that allows fluid to pass therethrough while the conductive material 112 remains in a solid state. In the example of FIG. 1, the interstitial spaces 101 of the conductive material 112 are at least partially occupied by a phase change material. The interstitial spaces 101 of the conductive material 112 may alternatively be at least partially occupied by two or more phase change materials, at least one phase change material and a refrigerant, or a refrigerant. The phase change material and/or a refrigerant filling the interstitial spaces 101 of the conductive material 112 are described in more detail below with reference to FIGS. 2A and 2B.

Continuing to refer to FIG. 1, one or more heat dissipating structures 114 may optionally be disposed on the top surface 104 of the body 102. The heat dissipating structure 114 may be an active heat transfer device, or a passive heat transfer device, among others. Examples of active heat transfer devices include fans, thermoelectric (i.e., Peltier) coolers, forced air or fluid heat exchangers, and the like. Examples of passive heat transfer devices include heat pipes, fins, and the like. In the example depicted in FIG. 1, the heat dissipating structure 114 is shown as a plurality of fins. The heat dissipating structure 114 transfers heat from the body 102. The heat dissipating structure 114 can be brazed, fastened or otherwise be in contact with or part of the body 102.

One or more bosses 116 may optionally protrude from the bottom surface 106 of the body 102. By protruding from the bottom surface 106, bosses 116 can advantageously provide a dedicated and properly sized die contact area on the bottom surface 106, which further facilitates good heat transfer to the body 102 from IC dies contacting the bosses 116. The boss 116 can include a textured surface 120. The textured surface 120 includes grooves 122c arranged in columns and grooves 122r arranged in rows that are perpendicular to and intersect with the grooves 122c at intersections 124. These intersections 124 may have a depth of about 0.2 mm. The example textured surface 120 illustrated in FIG. 1 also includes grooves 126n arranged diagonally to the grooves 122c, 122r. In one example, the grooves 126n intersect the grooves 122c, 122r at the intersections 124. The textured surface 120 also includes grooves 126p arranged diagonally to the grooves 122c, 122r. The grooves 126p also intersect the grooves 122c, 122r at the intersections 124. The grooves 126p, 126n intersect each other not only at the intersections 124, but also between the intersections 128. The flat regions 130 on the textured surface 120 are bounded by the grooves 122c, 122r, 126n, and/or 126p. As shown, the combined area of the grooves 122c, 122r, 126n, 126p disposed in the textured surface 120 is significantly smaller than (e.g., less than 40% of) the combined area of the flat regions 130. Advantageously, contact due to the textured surface 120 of the bosses 116 vents gasses more easily and quickly, resulting in less gas trapped in the interface (e.g., air voids are fewer and/or smaller in volume) when thermal interface material (TIM) is applied between the boss 116 and an adjacent IC die (not shown in FIG. 1).

The body 102 of the heat spreader 100 is made of a solid a conductive material, such as a metal. Suitable examples of the conductive material include aluminum (Al), stainless steel, copper (Cu) and the like. A plurality of vent holes 132 are disposed in the body 102 for injecting fluid, and venting air from an internal cavity 110 as the fluid is injected into the body 102.

FIG. 2A illustrates a first phase change material 200 disposed within an internal cavity 110 of the heat spreader shown in FIG. 1. The first phase change material 200 occupies less than only a portion of the interstitial spaces 101 of the thermally conductive material 112 filling the internal cavity 110, in the example shown. The first phase change material 200 can have a boiling point of between about 20° Celsius (C) and about 40° C., such as between about 25° C. and about 35° C. In one example, the boiling point of the first phase change material 200 is about 30° C. In another example, the first phase change material 200 has a phase change temperature of between about 25° C. and about 60° C. In yet another example, the boiling point of the first phase change material 200 is between about 195° C. and about 205° C., such as about 200° C. or about 202° C.

A thermal conductivity of the first phase change material 200 is between about 35 W(mK) and about 85 W/mK. In another example, thermal conductivity of the first phase change material 200 is between about 35 W(mK) and about 45 W/mK, such as about 40 W/mK or about 41 W/mK. In another example, thermal conductivity of the first phase change material 200 is between about 80 W(mK) and about 85 W/mK, such as about 81 W/mK or about 82 W/mK. In one example non-limiting example, the first phase change material 200 a liquid metal, such as gallium or indium.

The first phase change material 200 as a liquid metal has reduced viscosity, and may be considered "non-viscous" fluid. As such, the liquid metal can migrate throughout the interstitial spaces 101 of the thermally conductive material 112 filling the internal cavity 110 of the body 102 with minimal or no friction. Advantageously, the liquid metal has a high heat capacity due to the phase change at operational temperatures, the heat spreader 100 is very efficient at removing heat from objects in contact with the heat spreader 100, such as IC dies as later described below.

Figure 5:
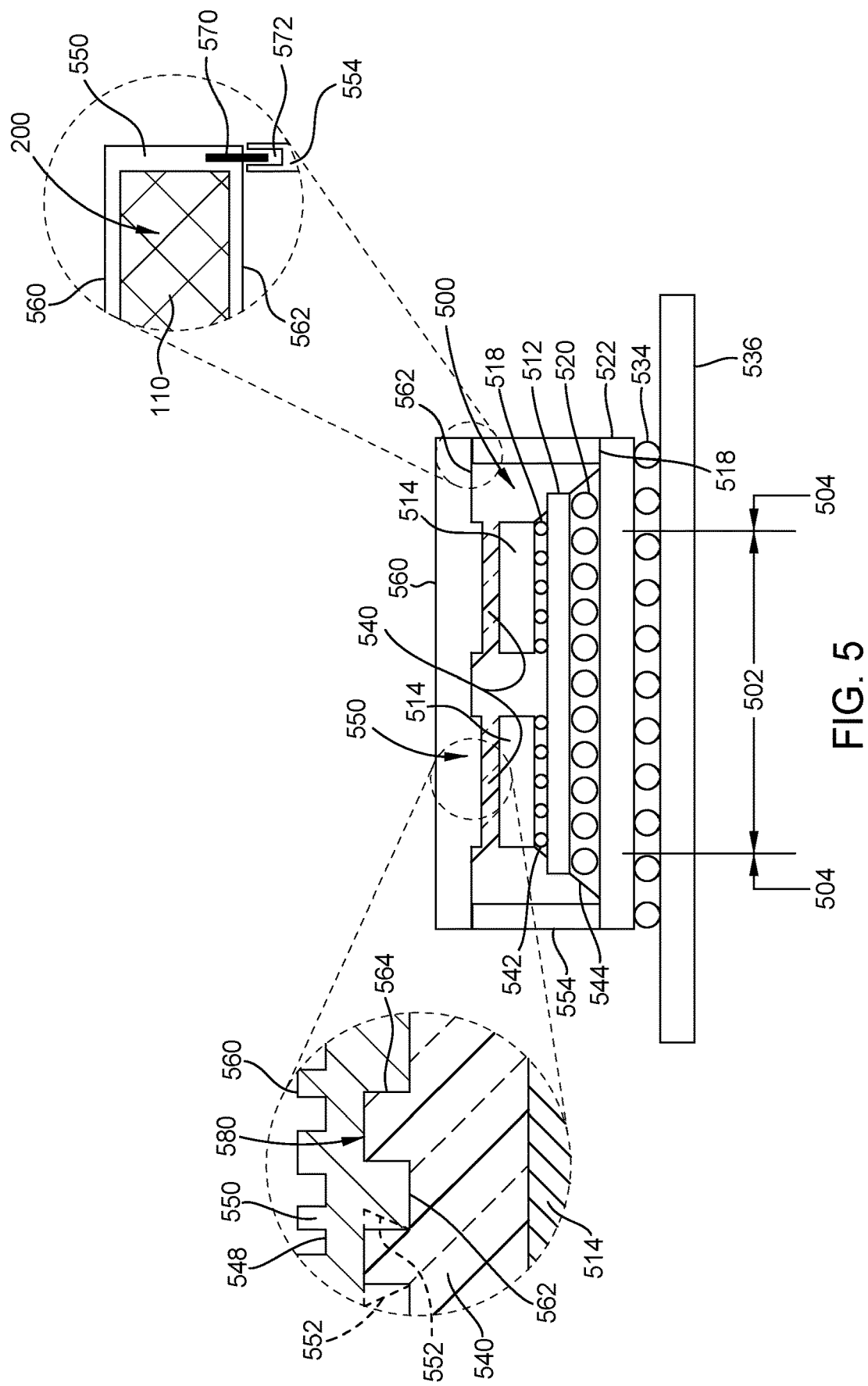
FIG. 5 is a cross sectional schematic view of an integrated chip package including one or more IC dies covered by a lid configured to mount the heat spreader shown in FIGS. 1-4.
Figure 6:
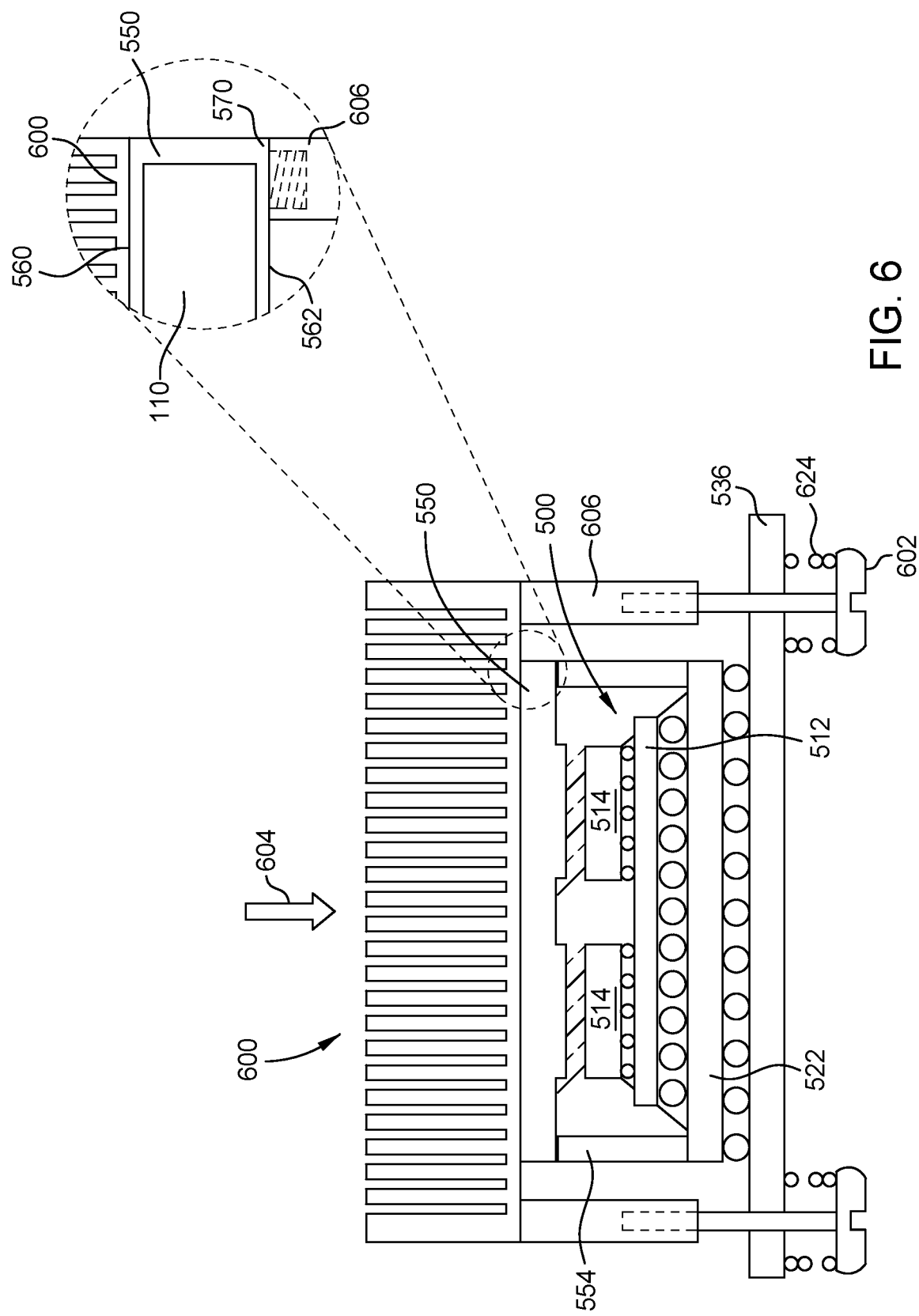
FIG. 6 is a side view of the integrated chip package having a heat sink mounted the heat spreader shown in FIGS. 1-5.

Although not illustrated in FIG. 2A, the thermally conductive material 112 is disposed within the internal cavity 110 of the body 102 along with the first phase change material 200. The phase first phase change material 200 fills the internal cavity 110 to about 90% to less than about 100% of a height 202 of the sidewalls 108. In another example, the phase first phase change material 200 fills the internal cavity 110 to about 90% to less than about 100% of the internal volume of the internal cavity 110. Advantageously, first phase change material 200 is selected to boil below the maximum operating temperature of an integrated chip package (shown in FIGS. 5 and 6). As the phase change material 200 is heated, latent heat energy is absorbed by the first phase change material 200 to convert the first phase change material 200 from a solid to a vapor. In this manner, the first phase change material 200 efficiently transfers heat from the bottom surface 106 to the top surface 104 of the body 102, making the heat spreader 100 a very efficient and robust temperature control solution for cooling integrated chip packages, as shown in FIGS. 5 and 6.

As discussed above and in one example, the thermally conductive material 112 is made of metal and has interstitial spaces 101 that enable a fluid (i.e., the phase change material 200) to flow through the metal. For example, the thermally conductive material 112 can be permeable, porous, perforated, foamed, a wire mesh, fibrous, open celled, honeycombed, or have another structure or physical property that allows fluid to pass therethrough. The thermally conductive material 112 may have a coefficient of thermal conductivity of between about 390 W/mK and about 405 about W/mK. Copper, in one example, is a suitable metal for fabricating the thermally conductive material 112, although other suitable metals, including copper and aluminum, can be utilized as the thermally conductive material 112.

As the first phase change material 200 reaches the boiling point, the first phase change material 200 in vapor phase moves away from a heat source (i.e., the bottom surface 106 of the body 102). For example, when the heat source is an IC die disposed proximate the bottom surface 106, the vapor of the first phase change material 200 moves towards the top surface 104 of the body 102. The vapor transfers heat from the heat source to and out of the top surface 104 of the body 102. The vapor then condenses to liquid and circulates back to the bottom surface 106 of the body 102 to be re-exposed to the heat source, and repeats the cycle.

FIG. 2B shows both a second phase change material 204 and the first phase change material 200 disposed within an internal cavity 110 of the heat spreader 100. The second phase change material 204 occupies at least a portion to all of the remaining percentage of the interstitial space 101 of the thermally conductive material 112 disposed within the internal cavity 110 of the body 102. In one example, the first phase change material 200 occupies about 25% to about 75% of the interstitial space 101 of the thermally conductive material 112, while the second phase change material 204 occupies at least a portion of the remaining percentage (for example, about 25% to about 75%) of the interstitial space 101 of the thermally conductive material 112 not occupied by the first phase change material 200. In another non-limiting example, the first phase change material 200 occupies about 25% and the second phase chamber material 204 occupies about 75% of the interstitial space of the thermally conductive material 112. In another non-limiting example, the first phase change material 200 fills about 50% of the interstitial space 101 of the thermally conductive material 112 within the internal cavity 110, while the second phase change material 204 substantially fills the remaining interstitial space 101 of the thermally conductive material 112. However, it is understood that the percentage that the first and second phase change materials 200, 204 fills the interstitial space 101 of the thermally conductive material 112 can be adjusted as desired. By adjusting the volumetric ratio of the second phase change material 204 to the first phase change material 200, the heat transfer rate and performance of the heat spreader 100 can be fine-tuned.

The first and second phase change materials 200, 204 are different. In one example, the second phase change material 204 has a higher boiling temperature than the first phase change material 200. The second phase change material 204 can be a refrigerant, having a boiling point between 45° C. and about 100° C., such as about 65° C. to about 75° C. In another example, the second phase change material 204 has a boiling point between about 45° C. to about 65° C. In one example, the second phase changer material 204 can be trichloroethane, or the like.

Although the thermally conductive material 112 is not visible in FIGS. 2A-2B, it is understood that the first phase change material 200 and/or the second phase change material 204 are disposed within the interstitial space 101 of the thermally conductive material 112 filling internal cavity 110 of the body 102 of the heat spreader 100.

Figure 3:
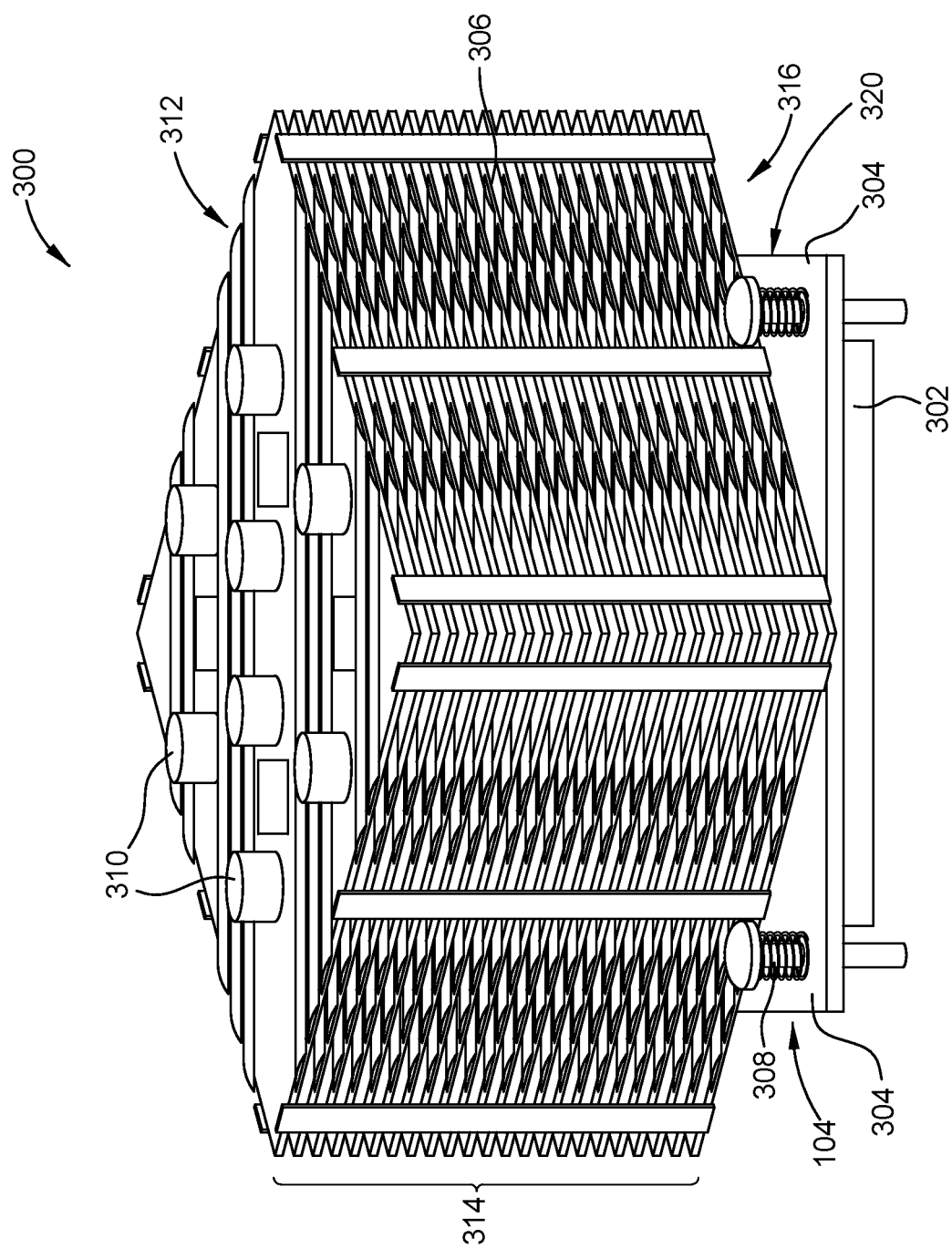
FIG. 3 shows a schematic isometric view of a heat dissipation structure that can be used with the heat spreader shown in FIGS. 1-2B.

FIG. 3 shows a schematic isometric view of another example of a heat spreader 320 integrated with a heat dissipation structure 300. The heat spreader 320 is substantially similar to the heat spreader 100 shown in FIG. 1. As such, the heat spreader 320 has a hollow body 302 that includes a top surface 104, a bottom surface 106, and sidewalls 108 that define an internal cavity 110 (as shown in FIG. 1). The hollow body 302 is shown in FIG. 3 without optional bosses 116 and includes mounting flanges 304 that extend from the top surface 104 of the hollow body 302.

The heat dissipation structure 300 is integrated with the top surface 104 of the hollow body 302. The heat dissipation structure 300 has a plurality of fins 306 (i.e., heat transfer fins). Each fin 306 of the plurality of fins 306 is oriented parallel to the top surface 104 of the hollow body 302. Stated differently, a longitudinal surface of each of the plurality of fins 306 is oriented parallel to the top surface 104 of the hollow body 302. The plurality of fins 306 have a top 312, a bottom 316, and an outer perimeter 314. Portions of the outer perimeter 314 may optionally extend beyond a perimeter of the hollow body 302. One or more hollow pillars 310 extend from the top surface 104 of the hollow body 302. The pillars 310 support the fins 306, and the fins 306 can be brazed or otherwise attached to the pillars 310.

The hollow pillars 310 have an internal volume that is contiguous with the internal cavity 110 of the hollow body 302. The contiguous internal volume and internal cavity 110 of the hollow pillars 310 and the hollow body 302 are filled with the thermally conductive material 112. As described above, the interstitial spaces 101 of the thermally conductive material 112 is at least partially or substantially filled with one or more phase change materials, such as phase change materials 200, 204.

Figure 4:
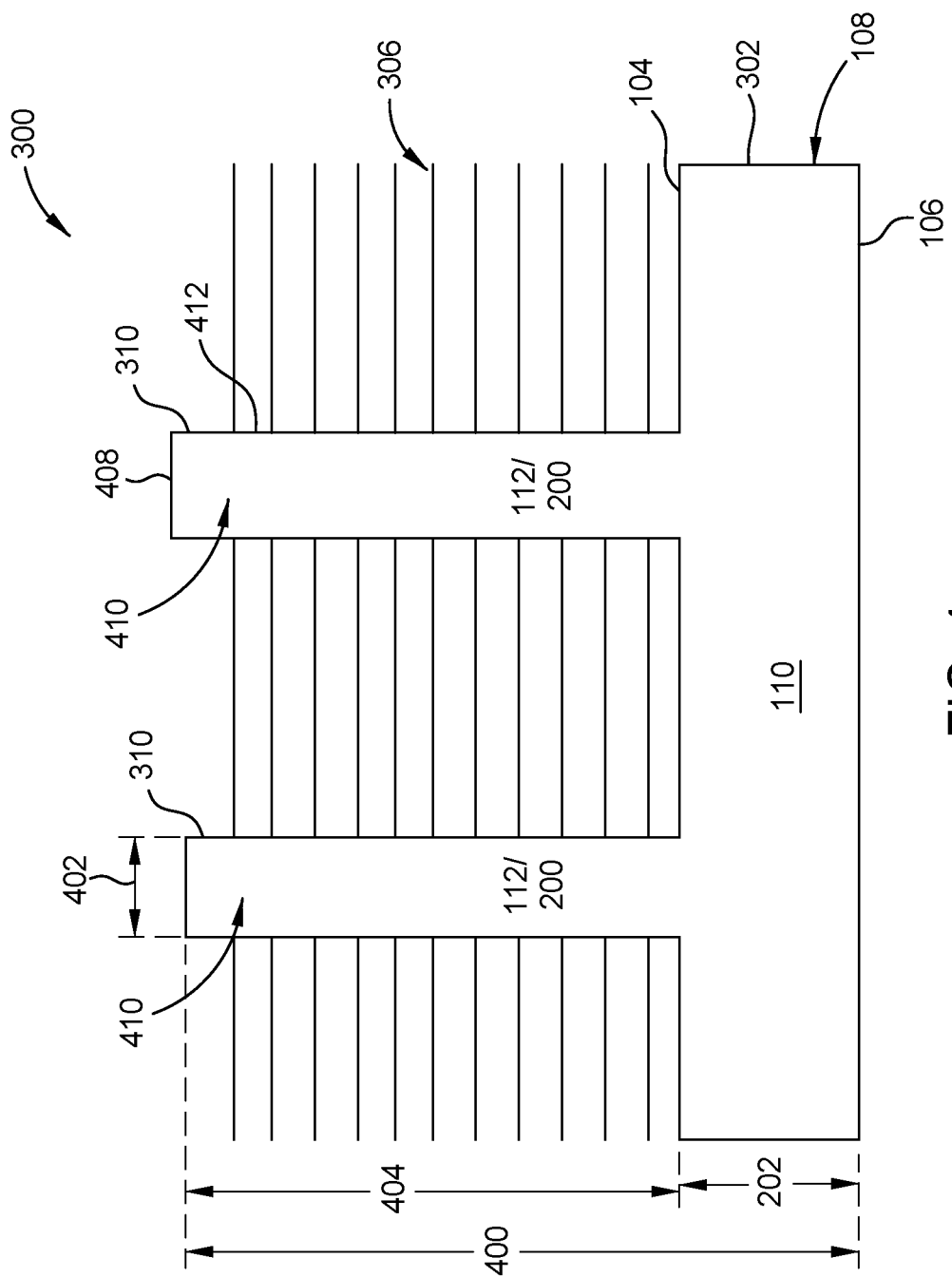
FIG. 4 is a schematic cross-sectional illustrating channels for storing the thermally conductive material and one or more phase change materials in the heat dissipation structure of FIG. 3.

FIG. 4 is a schematic cross-sectional of the heat dissipation structure 300 having the thermally conductive material 112 and the first phase change material 200 disposed therein. As noted, the plurality of hollow pillars 310 (i.e., hollow structures) are fluidly coupled to the hollow body 302, such that the internal cavity 110 of the heat dissipation structure 300 includes a volume of the hollow body 302, which includes the internal volume 410 of the plurality of hollow pillars 310. Accordingly, the internal volume 410 of each hollow pillar 310 forms a contiguous part of the sealed internal cavity 110. The plurality of fins 306 are shown in cross-section coupled to and extending from the hollow pillars 310. Although only the first phase change material 200 disposed in the cavity 110 is shown in FIG. 4, it is understood that the second phase change material 204 can be disposed, in the alternative or in combination with first phase change material 200, within the internal cavity 110 of the body 302 along with the thermally conductive material 112.

In FIG. 4, a combined height 400 of the heat dissipation structure 300 and the heat spreader body 302 are shown. Also shown are a width 402 and a height 404 of the hollow pillars 310. The height 202 of the hollow body 302 and the height 404 of the hollow pillars 310 are equal to the combined height 400 of the heat dissipation structure 300 and the heat spreader body 302.

The phase first phase change material 200 fills the internal cavity 110 to about 90% to less than about 100% of a height 202 of the hollow pillars 310. In another example, the phase first phase change material 200 fills the internal cavity 110 to about 90% to less than about 100% of the internal volume of the internal cavity 110. As the phase change material 200 is heated, latent heat energy is absorbed by the first phase change material 200 to convert the first phase change material 200 from a liquid to a vapor. The vapor of the first phase change material 200 raises into the hollow pillars 310, and transfer the heat to the fins 306 coupled to the hollow pillars 310. The fins 306 transfer heat from the body 302 outward to the ambient environment. Accordingly, the first phase change material 200 transfers heat from the bottom surface 106 of the body 302 to the plurality of hollow pillars 310, and from the plurality of hollow pillars 310 to the surrounding environment through the plurality of fins 306. Heat also dissipates through the sidewalls 412 and a top surface 408 of each hollow pillar 310, providing additional surface area for the heat dissipation structure 300. As noted, the second phase change material 204 can also optionally occupy the internal cavity 110 of the body 302, including hollow pillars 310, in substantially the same manner as described with respect to the internal cavity 110 of the heat spreader 100 described with reference to FIG. 2B.

Advantageously, the heat dissipation structure 300 enables the first phase change material 200 to flow into the hollow pillars 310 and dissipate heat an increased rate due to the large surface area provided by the fins 306 coupled to the sidewalls 412 of the hollow pillars 310. The overall performance of the heat dissipation structure 300 including the heat transfer rate can thus be fine-tuned by adjusting the volumetric ratio of the first phase change material 200 and the thermally conductive material 112.

The heat transfer circulation path of the heat dissipation structure 300 includes the hollow pillars 310 and hollow body 302. As the first phase change material 200 reaches the boiling point within the hollow body 302, the first phase change material 200 changes to a vapor phase and moves away from the bottom surface 106 of the body 102, which is proximate a heat source. For example, when the heat source is an IC die disposed adjacent to the bottom surface 106, the vapor of the first phase change material 200 moves towards the top surface 104 of the body 102. The vaporized portion of the first phase change material 200 rises towards the top surface 104 of the hollow body 302 and into the hollow pillars 310. Within the hollow pillars 310, the vaporized portion of the first phase change material 200 condenses back to a fluid as heat is transfer through the sidewalls 412 of the hollow pillars 310 and into the fins 306.

The vaporized portion of the first phase change material 200 disposed in the hollow pillars 310 cools and condenses to liquid, and then circulates (i.e., sinks) back to the bottom surface 106 of the body 102, thus completing the circulation path. At the bottom surface 106, the fluidic first phase change material 200 is again exposed to the heat source, reaches the boiling temperature, and again vaporizes and rises into the hollow pillars 310. When utilized with the thermally conductive material 112, the gaps and the metal surface of the thermally conductive material 112 utilize capillary forces to facilitate migration of the first phase change material 200 throughout the internal cavity 110, while enhancing the exchange of heat from the first phase change material 200 to the thermally conductive material 112.

FIG. 5 is a cross sectional schematic view of an integrated chip package 500 including one or more IC dies 514 interface with a heat spreader 550. The heat spreader 550 is configured the same as the heat spreader 100 described above. The chip package 500 includes at least one or more IC dies 514 connected optionally by a silicon-through-via (TSV) interposer 512 to a package substrate 522. Alternatively, the at least one or more IC dies 514 may be mounted directly to the package substrate 522 without the presence of an interposer 512. Although two IC dies 514 are shown in FIG. 5, the number of IC dies may range from one to as many as can be fit within the chip package 500.

The interposer 512 includes circuitry for electrically connecting the IC dies 514 to circuitry of the package substrate 522. The circuitry of the interposer 512 may optionally include transistors. Package bumps 520, also known as "C4 bumps," are utilized to provide an electrical connection between the circuitry of the interposer 512 and the circuitry of the package substrate 522. The package substrate 522 may be mounted and connected to a printed circuit board (PCB) 536, utilizing solder balls 534, wire bonding or other suitable technique. An undermolding 544 may be utilized to fill the space not taken by the package bumps 520 between the PCB 536 and the interposer 512, thereby providing structural rigidity to the chip package 500.

The IC dies 514 are mounted to one or more surfaces of the interposer 512, or alternatively in examples wherein an interposer is not utilized, to the package substrate 522. The IC dies 514 may be programmable logic devices, such as field programmable gate arrays (FPGA), memory devices, optical devices, processors or other IC logic structures. Optical devices include photo-detectors, lasers, optical sources, and the like. In the example depicted in FIG. 5, the IC dies 514 are mounted to a top surface of the interposer 512 by a plurality of micro-bumps 518. The micro-bumps 518 electrically connect the circuitry of each IC die 514 to circuitry of the interposer 512. The circuitry of the interposer 512 connects the micro-bumps 518 to selective package bumps 520, and hence, connects selective circuitry of each IC die 514 to the package substrate 522, to enable communication of the IC dies 514 with the PCB 536 after the chip package 500 is mounted within an electronic device (not shown). When the optional interposer 512 is not present, the micro-bumps 518 connects selective circuitry of each IC die 514 to the package substrate 522 to enable communication of the IC dies 514 with the PCB 536. An undermolding 542 may be utilized to fill the space not taken by the micro-bumps 518 between the IC dies 514 and interposer 512 to provide structural rigidity to the chip package 500.

The chip package 500 additionally includes a stiffener 554. The stiffener 554 is coupled to the package substrate 522 and circumscribes the IC dies 514. The stiffener 554 can extend to peripheral edges of the package substrate 522 to provide mechanical support which helps prevent the chip package 500 from bowing and warpage. The stiffener 554 may be a single layer structure or a multi-layer structure. The stiffener 554 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 554 can also be made of organic materials such as copper-clad laminate.

The heat spreader 550 is disposed over the IC dies 514. The heat spreader 550 has a top surface 560 and a bottom surface 562. The bottom surface 562 faces the IC dies 514. A heat sink may optionally be mounted to the top surface 560 of the heat spreader 550. In some examples, the heat sink includes heat dissipating structures 114, the heat dissipation structure 300, or other suitable heat sink.

As discussed above with the other examples of heat spreaders, the first phase change material 200 and the thermally conductive material 112 are disposed within the internal cavity 110 of heat spreader 550. As described above, the phase first phase change material 200 fills the internal cavity 110 to about 90% to less than about 100% of the internal volume of the internal cavity 110. Alternatively, the internal cavity 110 of the heat spreader 550 can be filled with the phase first phase change material 200 to about 90% to less than about 100% of a height of the sidewalls of the cavity 110. Heat from the one or more IC dies 514 will transfer from the bottom surface 562 of the heat spreader 550 to the top surface 560 of the heat spreader 550 through first phase change material 200 and the thermally conductive material 112, as described above with reference to FIGS. 1-4. In addition, the second phase change material 204 can be disposed within the internal cavity 110 as an alternative to or in combination with the first phase change material 200, as described above with reference to FIGS. 2A and 4.

Generally, the heat spreader 550 is at least disposed over the IC dies 514. A thermal interface material (TIM) 540 may be utilized to thermally and/or mechanically couple the heat spreader 550 to the IC dies 514. The TIM 540 may be selected to provide a thermally conductive path between the heat spreader heat spreader 550 to the IC dies 514 so that heat generated by the IC dies 514 may be more efficiently transferred to the heat spreader 550.

The TIM 540 is generally a heat transfer material having a conductivity of at least about 0.3 W/m·K. Examples of materials suitable for use the TIM 540 includes thermal grease, thermally conductive epoxy, phase change materials, conductive tapes, and silicone-coated fabrics among other suitable materials. The TIM 540 may be a soft or compliant adhesive to allow compensation between mismatched heights of neighboring IC dies 514 within the chip package 500. In one example, the TIM 540 may be a thermal gel or thermal epoxy, such as for example, packaging component attach adhesives available from Al Technology, Inc., located in Princeton Junction, New Jersey. In another example, the TIM 540 may be a phase change material, such as Laird PCM 780.

The heat spreader 550 may also be disposed over the stiffener 554. In some implementations, the heat spreader 550 may be bonded to the stiffener 554 by an adhesive (not shown), such as an epoxy.

In other implementations, the heat spreader 550 located relative to the stiffener 554 by a pin 570. The pin 570 may be attached to only one of the heat spreader 550 and the stiffener 554, so that the heat spreader 550 and stiffener are mechanically decoupled. The mechanical decoupling allows the heat spreader 550 to move freely (i.e., "float") relative to the stiffener 554. In this manner, stresses between the heat spreader 550 and the stiffener 554 are mechanically decoupled, resulting in less warpage and delamination of the various layers and components of the chip package 500.

In the example depicted in FIG. 5, the pin 570 is attached to the heat spreader 550. For example, the pin 570 may be bonded, screwed in, force fit or otherwise attached to the heat spreader 550. The pin 570 extends from the bottom surface 562 of the heat spreader 550 into a clearance hole 572 formed in a top of the stiffener 554 to allow the heat spreader 550 to move relative to the stiffener 554. In some implementations, the pin 570 is an integral part of the heat spreader 550. For example, the pin 570 may be formed by stamping the heat spreader 550 to project the pin 570 from the bottom surface 562 of the heat spreader 550. In another example, the pin 570 may be a projection formed during 3D printing of the heat spreader 550. One advantage of having the heat spreader 550 separate from the stiffener 554 is that the package assembler or even the end user may add the heat spreader 550. Beneficially, a chip package fabricator (not shown) can make and stock a single component, to which the package assembler, or other fabricator may add the heat spreader 550 at a later fabrication stage or even during use.

The bottom surface 562 of the heat spreader 550 may optionally include engineered features 580 which improve the interface between the heat spreader 550 and the TIM 540. In one example, the engineered features 580 may enhance the adhesion between the heat spreader 550 and the TIM 540. Increased adhesion between the heat spreader 550 and the TIM 540 helps maintain the heat spreader 550 firmly attached to the chip packaging 500. Alternatively or in addition increasing the adhesion between the heat spreader 550 and the TIM 540, the engineered features 580 may enhance the rate of heat transfer between the heat spreader 550 and the TIM 540. Increased heat transfer between the heat spreader 550 and TIM 540 helps maintain the temperature of the IC die 514. Accordingly, increasing heat transfer improves device performance and helps maintain performance uniformity between different chip packages.

The engineered feature 580 is generally a predefined structure formed in or on the bottom surface 562 of the heat spreader 550. For example, a predefined structure may be formed with a predefined geometry, such as cross-sectional area, height (or depth), width and pitch between structure. The engineered features 580 may be formed in a predefined pattern, for example, a pattern of structures that are spaced at regular and repeating intervals.

As only a region 502 of the heat spreader 550 above the IC dies 514 needs to be in contact with the TIM 540, the engineered features 580 may be only disposed in the region 502 above the IC dies 514. Thus, a region 504 of the heat spreader 550, typically disposed outward of the IC dies 514, may be free of engineered features 580, thereby reducing manufacturing costs. Alternatively, the engineered features 580 may extend completely or almost completely across the bottom surface 562 of the heat spreader 550.

The engineered features 580 function to increase the surface area of the heat spreader 550 that is in contact with the TIM 540. The increased surface area improves the adhesion between the heat spreader 550 and the TIM 540, thus reducing the potential of the heat spreader 550 delaminating from the chip package 500. Moreover, the increased surface area improves heat transfer between the heat spreader 550 and the TIM 540, thus improving the performance of the IC die 514.

In one example, such as shown in the enlarged portion of FIG. 5, the engineered features 580 are in the form of recesses 564 formed in the bottom surface 562 of the heat spreader 550. Each recess 564 may be a blind hole, dimple, groove, or have another suitable geometric form. The recesses 564 may have a circular, rectangular, hexagonal or other cross sectional profile. In the example illustrated in FIG. 5, the sidewalls of the recesses 564 are shown as being perpendicular to the bottom surface 562 of the heat spreader 550. The recesses 564 may be in the form of intersecting grooves, a grid, spiral, close packed array or other arrangement. Alternatively, the sidewalls of the recesses 564 may be disposed at an angle less than or greater than 90 degrees relative to the bottom surface 562 of the heat spreader 550. For example, sidewalls (552 shown in phantom) of the recess 564 may be tapered inward at the bottom of the recess 564 such that the bottom of the recess 564 is wider than the opening of the recess 564 at the bottom surface 562 of the heat spreader 550. In another example, the sidewalls of the recess 564 may include an undercut or groove. The taper, undercut and/or groove in the sidewalls of the recess 564 improves the adhesion of the TIM 540 to the heat spreader 550 by providing a mechanical interlock. The engineered features 580 may alternatively be projections.

The recesses 564 may be formed by machining, laser machining, pattern transfer or additive manufacturing process (such as 3-D printing), among others. Pattern transfer manufacturing techniques may utilize a mask to define openings that exposed predefined portions of the bottom surface 562 of the heat spreader 550, which may then be selectively removed by etching, bead blasting, grit blasting and the like, to form the recesses 564. Additive manufacturing processes sequentially stack material to form the heat spreader 550, leaving gaps in the stacked material that form the recesses 564 in the bottom surface 562 of the heat spreader 550 once the additive process is complete.

When used with TIM 540 in the form of a phase change material, the TIM 540 will flow between and around the engineered features 580. Accordingly, the TIM 540 softens at its phase change temperature, in an example of Laird 780Sp at about 70 degrees Celsius, to fill all potential gaps between engineered features 580 and the IC die 514, as well as, to form very thin TIM layer between the tip of the engineered features 580 and the IC die 514, which will very effectively spread the heat from the localized hots spot on the IC die 514.

Similarly, the top surface 560 of the heat spreader 550 may optionally include engineered features 580 that improve the interface between the heat spreader 550 and a TIM (not shown) disposed between the heat spreader 550 and the heat sink, such as the heat dissipating structures 114 or the heat dissipation structure 300. In one example, the engineered features 580 may enhance the rate of heat transfer between the heat spreader 550 and the heat sink disposed on the heat spreader 550. Increased heat transfer between the heat spreader 550 and heat sink helps maintain the temperature of the IC die 514, which in turn improves device performance and helps maintain performance uniformity between different chip packages. Additional examples that include thermal interface material and a heat sink are further discussed below.

In one example, such as shown in the enlarged portion of FIG. 5, the engineered features 580 are in the form of recesses 548 formed in the top surface 560 of the heat spreader 550. The recesses 548 may be formed similar to the recesses 564 formed in the bottom surface 562 of the heat spreader 550. The heat spreader described herein advantageously provides better heat transfer between the IC dies and the heat spreader 550. The better heat transfer between the lid and the dies reduces the potential of the lid delaminating from the chip package, better device performance, and increase reliability.

FIG. 6 is a side view of the integrated chip package 500 having a heat sink 600 mounted the heat spreader 550 shown in FIG. 5. The heat sink 600 is coupled to the PCB 536 in a manner that captures the heat spreader 550 against the IC dies 514 of the chip package 500. In some implementations, a fastener 602 may be threadingly engaged with the heat sink 600 so that the heat sink 600 exerts a force on the heat spreader 550 in a direction of the dies 514, as illustrated by arrow 604. The fastener 602 engages a threaded boss 606 that is coupled to the heat spreader 550. As illustrated, two threaded bosses 606 are disposed on the bottom surface 562 of the heat spreader 550. However, the number of threaded bosses 606 are not limited to two, and there can any desired number of bosses 606 as space permits. Optionally, a spring 624 or other resilient object may be disposed between the fastener 602 and the PCB 536 to provide force that the heat sink 600 exerts on the heat spreader 550. Advantageously, the force provided by the heat sink 600 allows the heat spreader 550 to maintain good thermal contact with the dies 514, while remaining floating on the stiffener 554.

As noted above, the heat transferred to the top surface 560 of the heat spreader 550 will be removed by the heat sink 600. While the foregoing is directed to examples of the present disclosure, other and further examples may be devised without departing from the basic scope thereof, and the scope thereof is determined by the claims that follow.

What is claimed is:

1. An apparatus, comprising:
   a lid for an integrated circuit package having a sealed cavity therein and a thermally conductive lower surface configured to contact an entirety of an upper surface of an integrated circuit die;
   a solid thermally conductive material disposed within the cavity, the thermally conductive material having interconnected interstitial spaces therethrough; and
   a phase change material disposed within at least a portion of the interstitial spaces;
   wherein a wall of the cavity adjacent to the lower surface of the lid extends over the entirety of the upper surface of the integrated circuit die such that the thermally conductive material and the phase change material are disposed above the entirety of the upper surface of the integrated circuit die.

2. The apparatus of claim 1, wherein the phase change material comprises a refrigerant.

3. The apparatus of claim 1, wherein the phase change material comprises liquid metal.

4. The heat spreader for use with the IC package apparatus of claim 3, wherein the liquid metal comprises one of gallium and indium the thermally conductive material filling the sealed internal cavity is a metal mesh, foam, or wool.

5. The apparatus of claim 1, wherein the phase change material comprises:
   first and second phase change materials, wherein phase change temperatures of the first and second phase change materials differ from one another.

6. The apparatus of claim 5, wherein:
   the first phase change material comprises liquid metal; and
   the second phase change material comprises a refrigerant.

7. The apparatus of claim 6, wherein:
   the first phase change material comprises one of gallium an indium; and
   the second phase change material comprises trichloroethane.

8. The apparatus of claim 5, wherein:
   the phase change temperature of the first phase change material is between 20 degrees C. and 60 degrees C.; and
   the phase change temperature of the second phase change material is between 45 degrees C. and 100 degrees C.

9. The apparatus of claim 1, wherein the lid comprises a boss extending from the lower surface, dimensioned to contact the entirety of the upper surface of the integrated circuit die, wherein a surface of the boss has grooves.

10. The apparatus of claim 1, wherein the thermally conductive material comprises one or more of a metal mesh, a foam, fibers, and wool.

11. The apparatus of claim 1, further comprising:
    a tube having an open first end that extends into the cavity, and a closed second end external of the cavity; and
    additional solid thermally conductive material disposed within the tube.

12. The apparatus of claim 11, further comprising:
additional phase change material disposed within at least a portion of interconnected interstitial spaces of the additional solid thermally conductive material disposed within the tube;
wherein the additional phase change material is in fluid contact with the phase change material disposed within the interconnected interstitial spaces of the thermally conductive material disposed within the cavity.

13. The apparatus of claim 11, further comprising:
a plurality of heat transfer fins extending from and in contact with an exterior surface of the tube.

14. An device comprising:
a chip package comprising a first integrated circuit die;
sidewalls surrounding the first integrated circuit die;
a lid configured to mount to edges of the sidewalls, wherein the lid has a sealed cavity therein and a thermally conductive lower surface in contact an entirety of an upper surface of the first integrated circuit die;
a thermally conductive material disposed within the cavity, the thermally conductive material having interconnected interstitial spaces therethrough; and
a phase change material disposed within at least a portion of the interstitial spaces;
wherein a wall of the cavity adjacent to the lower surface of the lid extends over the entirety of the upper surface of the first integrated circuit die such that the thermally conductive material and the phase change material are disposed above the entirety of the upper surface of the first integrated circuit die.

15. The device of claim 14, wherein:
one of the lower surface of the lid and the edges of the sidewalls comprises a pin extending therefrom; and
the other one of the lower surface of the lid and the edges of the sidewalls has an opening in a surface thereof configured to receive the pin;
wherein the pin and the opening are dimensioned to permit the lid to move relative to the sidewalls.

16. The device of claim 14, further comprising:
a printed circuit board;
wherein the chip package is mounted to the printed circuit board.

17. The electronic device of claim 14, wherein the phase change material comprises a refrigerant.

18. The device of claim 17, wherein the wall of the cavity adjacent to the lower surface of the lid further extends over an entirety of an upper surface of a second integrated circuit die of the chip package such that the thermally conductive material and the phase change material are disposed above the entireties of the upper surfaces of the first and second integrated circuit dies.

19. The device of claim 14, wherein the phase change material comprises:
first and second phase change materials, wherein phase change temperatures of the first and second phase change materials differ from one another.

20. The device of claim 19, wherein:
the first phase change material comprises liquid metal; and
the second phase change material comprises a refrigerant.

* * * * *